US012680053B2

(12) United States Patent
Yamamoto et al.

(10) Patent No.: US 12,680,053 B2

(45) Date of Patent: Jul. 14, 2026

(54) METHOD FOR MANUFACTURING A RESIST PATTERN USING AN AQUEOUS CLEANING SOLUTION COMPRISING A C4-C12 ALKYLCARBOXYLIC ACID

(71) Applicant: Merck Patent GmbH, Darmstadt (DE)

(72) Inventors: Kazuma Yamamoto, Kakegawa (JP); Tomoyasu Yashima, Kakegawa (JP); Maki Ishii, Kakegawa (JP)

(73) Assignee: Merck Patent GmbH, Darmstadt (DE)

(*) Notice: Subject to any disclaimer, the term of this patent is extended or adjusted under 35 U.S.C. 154(b) by 364 days.

(21) Appl. No.: 17/917,004

(22) PCT Filed: Apr. 1, 2021

(86) PCT No.: PCT/EP2021/058571

§ 371 (c)(1),
(2) Date: Oct. 5, 2022

(87) PCT Pub. No.: WO2021/204651

PCT Pub. Date: Oct. 14, 2021

(65) Prior Publication Data

US 2023/0167383 A1 Jun. 1, 2023

(30) Foreign Application Priority Data

Apr. 6, 2020 (JP) ................................ 2020-068224

(51) Int. Cl.

| | |
|---|---|
| ***C11D 7/50*** | (2006.01) |
| ***C11D 3/04*** | (2006.01) |
| ***C11D 3/20*** | (2006.01) |
| ***C11D 17/00*** | (2006.01) |
| ***G03F 7/039*** | (2006.01) |
| ***G03F 7/20*** | (2006.01) |
| ***G03F 7/40*** | (2006.01) |

(52) U.S. Cl.

CPC ............ *C11D 3/2079* (2013.01); *C11D 3/044* (2013.01); *C11D 17/0008* (2013.01); *G03F 7/0392* (2013.01); *G03F 7/2004* (2013.01); *G03F 7/40* (2013.01); *C11D 2111/22* (2024.01)

(58) Field of Classification Search

CPC ... C11D 2111/22; C11D 3/2079; C11D 3/044; C11D 17/0008; C11D 2111/16; C11D 7/50

See application file for complete search history.

(56) References Cited

U.S. PATENT DOCUMENTS

| | | | | |
|---|---|---|---|---|
| 6,372,415 | B1 | 4/2002 | Nomoto et al. | |
| 2009/0305164 | A1 | 12/2009 | Lingier | |
| 2010/0105595 | A1* | 4/2010 | Lee | H01L 21/02063 510/176 |
| 2010/0248164 | A1 | 9/2010 | Kumagai et al. | |
| 2014/0030660 | A1* | 1/2014 | Takanashi | G03F 7/26 106/287.18 |
| 2017/0242337 | A1 | 8/2017 | Kasahara et al. | |
| 2020/0326630 | A1* | 10/2020 | Kumagai | G03F 7/425 |
| 2020/0360861 | A1* | 11/2020 | Omatsu | B01D 71/80 |
| 2022/0028685 | A1* | 1/2022 | Waller | G03F 7/0042 |

FOREIGN PATENT DOCUMENTS

| | | | |
|---|---|---|---|
| CN | 107499016 | A | 12/2017 |
| EP | 1708033 | A2 | 10/2006 |
| EP | 1854627 | A1 | 11/2007 |
| JP | H0-219847 | A | 1/1990 |
| JP | H02-209977 | A | 8/1990 |
| JP | H11-249323 | A | 9/1999 |
| JP | 2005-070118 | A | 3/2005 |
| JP | 2007-200944 | A | 8/2007 |
| JP | 2007-254555 | A | 10/2007 |
| JP | 2011-128610 | A | 6/2011 |
| JP | 2012-060050 | A | 3/2012 |
| JP | 5336306 | B2 | 8/2013 |
| JP | 2014-219577 | A | 11/2014 |
| JP | 2016-031503 | A | 3/2016 |
| KR | 10-0573560 | B1 | 8/2006 |
| TW | 201035307 | A | 10/2010 |
| TW | 201840837 | A | 11/2018 |
| WO | 2017/220479 | A1 | 12/2017 |
| WO | 2018/095885 | A1 | 5/2018 |
| WO | 2018/141944 | A1 | 8/2018 |
| WO | 2019/026885 | A1 | 2/2019 |
| WO | 2019/181387 | A1 | 9/2019 |

OTHER PUBLICATIONS

International Search Report and Written Opinion received for PCT Patent Application No. PCT/EP2021/058571, mailed on Jul. 20, 2021, 13 pages.

Namatsu, et al., "Dimensional limitations of silicon nanolines resulting from pattern distortion due to surface tension of rinse water", Applied Physics Letters, vol. 66, No. 20, May 15, 1995, pp. 2655-2657.

"International Preliminary Report on Patentability received for PCT Application No. PCT/EP2021/058571, mailing date Oct. 20, 2022", 10 Pages.

* cited by examiner

*Primary Examiner* — Charles I Boyer

(74) *Attorney, Agent, or Firm* — Versum Materials US, LLC; David K. Benson

(57) ABSTRACT

[Problem] To provide an electronic device manufacturing aqueous solution, which makes it possible to prevent pattern collapse or suppress non-uniformity of resist pattern width. [Means for Solution] An electronic device manufacturing aqueous solution comprising an alkylcarboxylic acid compound (A) and a solvent (B), wherein the alkylcarboxylic acid compound (A) is represented by the formula (a): $A_1$-COOH (a), wherein $A_1$ is $C_{4-12}$ alkyl, and the solvent (B) comprises water.

12 Claims, 1 Drawing Sheet

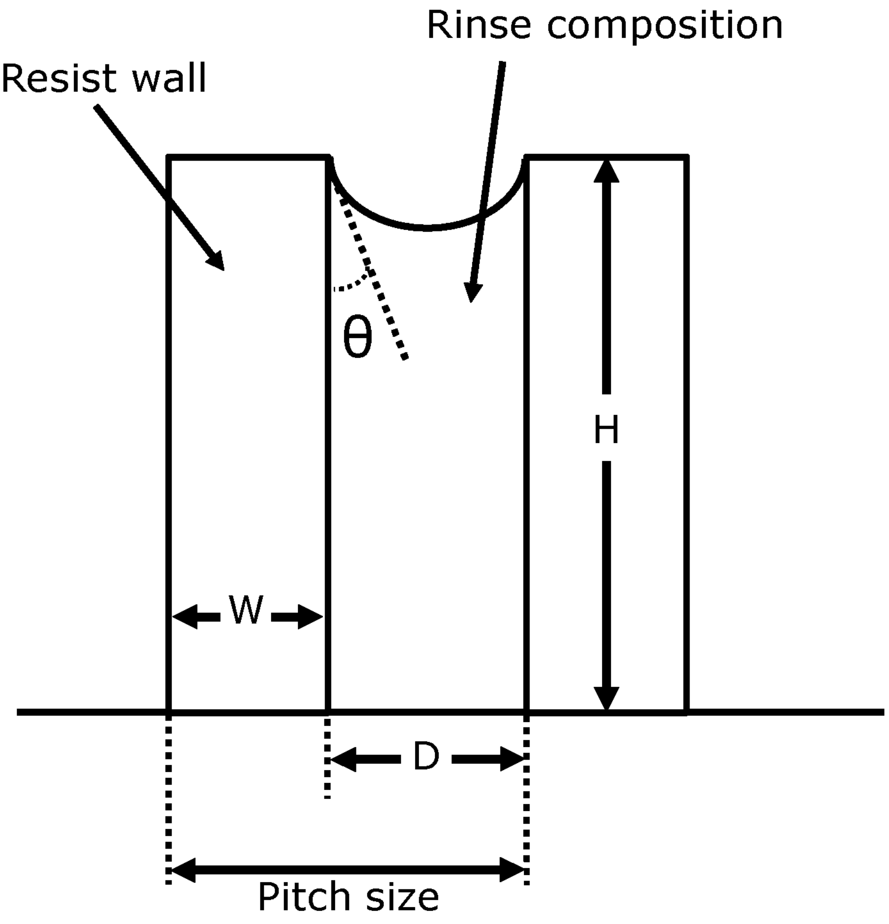
Rinse composition
Resist wall
θ
H
W
D
Pitch size

METHOD FOR MANUFACTURING A RESIST PATTERN USING AN AQUEOUS CLEANING SOLUTION COMPRISING A C4-C12 ALKYLCARBOXYLIC ACID

CROSS-REFERENCE TO RELATED APPLICATIONS

This application is a national stage application (under 35 U.S.C. § 371) of PCT/EP2021/058571, filed Apr. 1, 2021, which claims benefit of Japanese Application No. 2020-068224, filed Apr. 6, 2020, both of which are incorporated herein by reference in their entirety.

BACKGROUND OF THE INVENTION

Technical Field

The present invention relates to an electronic device manufacturing aqueous solution, a method for manufacturing a resist pattern and a method for manufacturing a device.

Background Art

In recent years, needs for high integration of LSI has been increasing, and refining of patterns is required. In order to respond such needs, lithography processes using KrF excimer laser (248 nm), ArF excimer laser (193 nm), extreme ultraviolet (EUV; 13 nm), X-ray of short wavelength, electron beam or the like have been put to practical use. In order to respond to such refining of resist patterns, also for photosensitive resin compositions to be used as a resist during refining processing, those having high resolution are required. Finer patterns can be formed by exposing with light of short wavelength, but since an extremely fine structure is formed, a yield becomes a problem due to fine pattern collapse or the like.

Under such circumstances, in Patent Document 1, a rinse liquid for lithography, which has good performance such as pattern collapse margin, defect, and LWR as in the conventional system containing a surfactant, and also has good characteristics in melting, has been studied.

Further, as another attempt there are studies to use a fluorine-containing surfactant (Patent Document 2 and Patent Document 3).

PRIOR ART DOCUMENTS

Patent Documents

[Patent document 1] JP 2014-219577 A
[Patent document 2] WO 2018/095885
[Patent document 3] WO 2017/220479

SUMMARY OF THE INVENTION

Problems to be Solved by the Invention

The present inventors considered that there are one or more problems still need improvements. Examples of these include the followings: reducing defects in fine resist patterns; suppressing bridge formation in resist patterns; preventing resist pattern collapse in fine resist patterns; suppressing resist pattern width non-uniformity; reducing the residue after removing an electronic device manufacturing aqueous solution; reducing the surface tension of an electronic device manufacturing aqueous solution; providing an electronic device manufacturing aqueous solution with less environmental impact; providing an electronic device manufacturing aqueous solution with low handling risk; and providing an electronic device manufacturing aqueous solution having good storage stability (for example, long-term storage).

The present invention has been made based on the technical background as described above, and provides an electronic device manufacturing aqueous solution.

Means for Solving the Problems

The electronic device manufacturing aqueous solution comprises an alkylcarboxylic acid compound (A); and a solvent (B), wherein the alkylcarboxylic acid compound (A) is represented by the formula (a):

$$A_1\text{-COOH} \qquad (a)$$

where $A_1$ is $C_{4-12}$ alkyl, preferably $A_1$ is linear or branched $C_{5-10}$ alkyl, and the solvent (B) comprises water.

The method for manufacturing a resist pattern according to the present invention uses the above-mentioned electronic device manufacturing aqueous solution.

The method for manufacturing a device according to the present invention comprises the above-mentioned method for manufacturing a resist pattern.

Effects of the Invention

Using the electronic device manufacturing aqueous solution according to the present invention, it is possible to expect one or more of the following effects.

It is possible to reduce defects in fine resist patterns. It is possible to suppress the formation of bridges in the resist patterns. It is possible to prevent the resist pattern collapse in fine resist patterns. It is possible to suppress the resist pattern width non-uniformity. It is possible to reduce the residue after removing an electronic device manufacturing aqueous solution. It is possible to reduce the surface tension of an electronic device manufacturing aqueous solution. It is possible to reduce the environmental impact of an electronic device manufacturing aqueous solution. It is possible to reduce the handling risk of an electronic device manufacturing aqueous solution. It is possible to make good storage stability of an electronic device manufacturing aqueous solution.

BRIEF DESCRIPTION OF THE DRAWING

FIG. 1 is a schematic illustration showing the condition of resist walls rinsing.

DETAILED DESCRIPTION OF THE INVENTION

Mode for Carrying Out the Invention

Embodiments of the present invention are described below in detail.

Definitions

Unless otherwise specified in the present specification, the definitions and examples described in this paragraph are followed.

The singular form includes the plural form and "one" or "that" means "at least one". An element of a concept can be expressed by a plurality of species, and when the amount (for example, mass % or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has plural types of repeating units, these repeating units copolymerize. These copolymerization may be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, 20 degrees means 20 degrees Celsius.

The additive refers to a compound itself having a function thereof (for example, in the case of a base generator, a compound itself that generates a base). An embodiment in which a compound is dissolved or dispersed in a solvent and added to a composition is also possible. As one embodiment of the present invention, it is preferable that such a solvent is contained in the composition according to the present invention as the solvent (B) or another component.

<Electronic Device Manufacturing Aqueous Solution>

The electronic device manufacturing aqueous solution according to the present invention comprises an alkylcarboxylic acid compound (A) and a solvent (B).

Here, the electronic device manufacturing aqueous solution is one used in the process of manufacturing an electronic device. It can be one used in the manufacturing process of an electronic device and can be one being removed or lost in the course of the process. Examples of the electronic device include display devices, LED and semiconductor devices.

The electronic device manufacturing aqueous solution is preferably a semiconductor substrate manufacturing aqueous solution; more preferably a semiconductor substrate manufacturing process cleaning liquid; further preferably a lithography cleaning liquid; and further more preferably a resist pattern cleaning liquid. The electronic device manufacturing aqueous solution that is a semiconductor substrate manufacturing aqueous solution can also be said to be a semiconductor substrate manufacturing aqueous solution consisting only of the electronic device manufacturing aqueous solution of the present invention.

As another embodiment of the present invention, the electronic device manufacturing aqueous solution can be a rinse composition used for rinsing an exposed and developed resist pattern.

Alkylcarboxylic Acid Compound (A)

The alkylcarboxylic acid compound (A) used in the present invention is represented by the formula (a):

$$A_1\text{-COOH} \qquad (a)$$

where $A_1$ is $C_{4-12}$ alkyl. $A_1$ can be linear, branched or cyclic alkyl. $A_1$ is preferably linear or branched $C_{5-10}$ alkyl; more preferably linear or branched $C_{6-10}$ alkyl; further preferably linear or branched $C_{6-9}$ alkyl; and further more preferably linear or branched $C_{6-8}$ alkyl.

Exemplified embodiments of the alkylcarboxylic acid compound (A) include n-hexanoic acid, n-heptanoic acid, n-octanoic acid, 2-methylpentanoic acid, 2-methylhexanoic acid, 5-methylhexanoic acid, 2-methylheptanoic acid, 4-methyl-n-octanoic acid, 2-ethylhexanoic acid, 2-propylpentanoic acid, 2,2-dimethylpentanoic acid and 3,5,5-trimethylhexanoic acid.

The content of the alkylcarboxylic acid compound (A) is preferably 0.01 to 10 mass %, more preferably 0.02 to 5 mass %, further preferably 0.02 to 1 mass %, and further more preferably 0.03 to 0.5 mass %, based on the electronic device manufacturing aqueous solution.

One of the effects of the alkylcarboxylic acid compound (A) in the electronic device manufacturing aqueous solution according to the present invention is to contribute to the prevention of pattern collapse after development of the resist pattern. Although not to be bound by theory, it is considered that the low affinity between the alkylcarboxylic acid compound of the present invention and the resist wall can increase the contact angle of the electronic device manufacturing aqueous solution during the process of drying the rinse. In particular, it is considered that the alkyl in the formula (a) can reduce the surface tension of the composition, and the carboxyl can improve the solubility of the electronic device manufacturing aqueous solution, thereby being capable of making the balance between the solubility and the low surface tension improved.

Solvent (B)

The solvent (B) comprises water. The water is preferably deionized water.

Considering that it is used in the electronic device manufacturing process, the solvent (B) is preferably one having few impurities. The preferred solvent (B) contains impurities of 1 ppm or less; more preferably 100 ppb or less, and further preferably 10 ppb or less.

The content of water based on the solvent (B) is preferably 90 to 100 mass %, more preferably 98 to 100 mass %; further preferably 99 to 100 mass %; and further more preferably 99.9 to 100 mass %. In a preferred embodiment of the present invention, the solvent (B) consists substantially only of water. However, an embodiment in which an additive is dissolved and/or dispersed in a solvent other than water (for example, a surfactant) and contained in the electronic device manufacturing aqueous solution of the present invention is accepted as a preferred embodiment of the present invention.

As exemplified embodiments of the solvent (B) excluding water, for example, cyclohexanone, cyclopentanone, propylene glycol monomethyl ether (PGME), propylene glycol monoethyl ether, propylene glycol monopropyl ether, propylene glycol monobutyl ether, propylene glycol dimethyl ether, propylene glycol diethyl ether, propylene glycol 1-monomethyl ether 2-acetate (PGMEA), propylene glycol monoethyl ether acetate, propylene glycol monopropyl ether acetate, γ-butyrolactone, ethyl lactate, or any mixture of any of these are preferable. These are preferable in terms of storage stability of the solution. These solvents can be also used as any mixture of any two or more.

The content of the solvent (B) is preferably 80 to 99.99 mass %, more preferably 90 to 99.99 mass %, further preferably 95 to 99.99 mass %, and further more preferably 98 to 99.99 mass %, based on the electronic device manufacturing aqueous solution.

Further, the content of the water contained in the solvent (B) is preferably 80 to 99.99 mass %, more preferably 90 to 99.99 mass %, further preferably 95 to 99.99 mass %, and further more preferably 98 to 99.99 mass %, based on the electronic device manufacturing aqueous solution.

The electronic device manufacturing aqueous solution according to the present invention essentially comprises the above-mentioned components (A) and (B), but can comprise further compounds, if necessary. Details thereof are described below. In addition, the components other than (A) and (B) (in the case of a plurality, the sum thereof) in the entire composition are preferably 0 to 10 mass %, more preferably 0 to 5 mass %, and further preferably 0 to 3 mass %, based on the electronic device manufacturing aqueous solution. The embodiment in which the electronic device manufacturing aqueous solution according to the present invention contains no component other than (A) and (B) (0 mass %) is also a preferred embodiment of the present invention.

Hydroxy-Containing Compound (C)

The electronic device manufacturing aqueous solution according to the present invention can further comprise a hydroxy-containing compound (C). The hydroxy-containing compound (C) may have 1 or more hydroxy in the compound, and is preferably a $C_{3-30}$ compound, which has 1 to 3 hydroxy and may be fluorine-substituted. The fluorine substitution in this case substitutes the H of the compound with F, but this substitution does not substitute the H in the hydroxy.

It is considered that further including the hydroxy-containing compound (C) makes it possible to further reduce the limit size that does not collapse.

As a preferred embodiment, the hydroxy-containing compound (C) is represented by the formula (c).

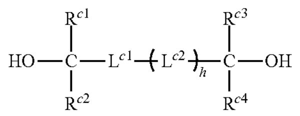

(c)

where $R^{c1}$, $R^{c2}$, $R^{c3}$ and $R^{c4}$ are each independently hydrogen, fluorine or $C_{1-5}$ alkyl; preferably, each independently hydrogen, fluorine, methyl, ethyl, t-butyl or isopropyl; and more preferably, each independently hydrogen, methyl or ethyl.

$L^{c1}$ and $L^{c2}$ are each independently $C_{1-20}$ alkylene, $C_{1-20}$ cycloalkylene, $C_{2-4}$ alkenylene, $C_{2-4}$ alkynylene or $C_{6-20}$ allylene. These groups can be substituted with fluorine, $C_{1-5}$ alkyl or hydroxy. Here, alkenylene means a divalent hydrocarbon having one or more double bonds, and alkynylene means a divalent hydrocarbon group having one or more triple bonds. Preferably, $L^{c1}$ and $L^{c2}$ are each independently fluorine-substituted $C_{1-5}$ alkylene, $C_{2-4}$ alkynylene or phenylene ($C_6$ allylene). $L^{c1}$ and $L^{c2}$ are more preferably, each independently fluorine-substituted $C_{2-4}$ alkylene, acetylene ($C_2$ alkynylene) or phenylene; and further more preferably, fluorine-substituted $C_{2-4}$ alkylene or acetylene.

It is possible to obtain the effects of the present invention without using any fluorine-containing component. As such an embodiment, $L^{c1}$ and $L^{c2}$ are each independently $C_{1-5}$ alkylene, $C_{2-4}$ alkynylene or phenylene; more preferably, each independently $C_{2-4}$ alkylene, acetylene or phenylene; and further more preferably, each independently $C_{2-4}$ alkylene or acetylene.

h is 0, 1 or 2, preferably 0 or 1, and more preferably 0.

Exemplified embodiments of the hydroxy-containing compound (C) include 3-hexyne-2,5-diol, 2,5-dimethyl-3-hexyne-2,5-diol, 3,6-dimethyl-4-octine-3,6-diol, 1,4-butynediol, 2,4-hexadiyne-1,6-diol, 1,4-butanediol, 2,2,3,3-tetrafluoro-1,4-butanediol, 2,2,3,3,4,4,5,5-octafluoro-1,6-hexanediol, cis-1,4-dihydroxy-2-butene, 1,4-benzenedimethanol, and any combination of any of these.

The content of the hydroxy-containing compound (C) is preferably 0.001 to 10 mass %, more preferably 0.005 to 5 mass %, further preferably 0.01 to 1 mass %, based on the electronic device manufacturing aqueous solution.

Surfactant (D)

The electronic device manufacturing aqueous solution according to the present invention can further comprise a surfactant (D). The surfactant (D) is useful for improving coatability and solubility. Here, the surfactant (D) is different one from the alkylcarboxylic acid compound (A) and the hydroxyl-containing compound (C).

Examples of the surfactant (D) include polyoxyethylene alkyl ether compounds, such as polyoxyethylene lauryl ether, polyoxyethylene stearyl ether and polyoxyethylene oleyl ether, polyoxyethylene alkylaryl ether compounds, such as polyoxyethylene octylphenyl ether and polyoxyethylene nonylphenol ether, polyoxyethylene/polyoxypropylene block copolymer compounds, sorbitan fatty acid ester compounds, such as sorbitan monolaurate, sorbitan monopalmitate, sorbitan monostearate, sorbitan trioleate and sorbitan tristearate, polyoxyethylene sorbitan fatty acid ester compounds, such as polyoxyethylene sorbitan monolaurate, polyoxyethylene sorbitan monopalmitate, polyoxyethylene sorbitan monostearate and polyoxyethylene sorbitan tristearate. In addition, fluorosurfactants such as trade names Eftop EF301, EF303, EF352 (Tohkem Products), trade names Megaface F171, F173, R-08, R-30, R-2011 (DIC), Fluorad FC430, FC431 (Sumitomo 3M), and trade names Asahi-Guard AG710, Surflon S-382, SC101, SC102, SC103, SC104, SC105, SC106 (AGC); and organosiloxane polymer KP341 (Shin-Etsu Chemical) or the like are exemplified.

The content of the surfactant (D) is preferably 0.01 to 5 mass %, more preferably 0.02 to 0.5 mass %, based on the electronic device manufacturing aqueous solution.

Additive (E)

The electronic device manufacturing aqueous solution according to the present invention can further comprise an additive (E). In the present invention, the additive (E) comprises an acid (excluding the alkylcarboxylic acid compound (A)), a base, a germicide, an antibacterial agent, a preservative, a fungicide, or any combination of any of these.

The acid or base can be used to adjust the pH value of the treating liquid and improve the solubility of additive components. Examples of the acid include aromatic carboxylic acids.

The additive (E) preferably comprises a base. Examples of the base include ammonia, primary amines, secondary amines, tertiary amines and ammonium compounds. These compounds can be unsubstituted or substituted with substituent(s). More particularly, ammonia, monoethanolamine, diethanolamine, triethanolamine, triisopropanolamine, ethylenediamine, diethylenetriamine, pentaethylenehexamine, piperidine, piperazine, morpholine, tetramethylammonium hydroxide, and any combination of any of these can be mentioned. One embodiment of a suitable base is ammonia. The content of the base is preferably 0.01 to 0.3 mass %, based on the electronic device manufacturing aqueous solution.

The additive (E) can comprise an antibacterial agent, a bactericidal agent, a preservative or a germicide, if necessary. These chemicals are used to prevent bacteria or fungi from propagating over time. Examples of these chemicals include alcohols such as phenoxyethanol, and isothiazolone. Bestcide (Nippon Soda) is a particularly effective antibacterial agent, bactericidal agent and germicide. The content of these chemicals is preferably 0.00005 to 0.1 mass %, more preferably 0.0001 to 0.01 mass %, based on the electronic device manufacturing aqueous solution.

The content of the additive (E) is preferably 0.0001 to 10 mass %, more preferably 0.0005 to 0.1 mass %, based on the electronic device manufacturing aqueous solution.

The electronic device manufacturing aqueous solution according to the present invention can be filtered with a filter to remove impurities and/or insolubles after dissolving its components.

<Method for Manufacturing a Resist Pattern>

The present invention also provides a method for producing a resist pattern using the above-mentioned electronic device manufacturing aqueous solution. The photosensitive resin composition (resist composition) used in the method may be either a positive type or a negative type; the positive type is more preferable. A typical method for manufacturing a resist pattern to which the electronic device manufacturing aqueous solution according to the present invention is applied comprises the following steps:

(1) applying a photosensitive resin composition on a substrate with or without one or more intervening layers, to form a photosensitive resin layer;
(2) exposing the photosensitive resin layer to radiation;
(3) developing the exposed photosensitive resin layer; and
(4) cleaning the developed layer with the above-mentioned electronic device manufacturing aqueous solution.

Hereinafter, details are explained. First, a photosensitive resin composition is applied (for example, laminated) above a substrate such as a silicon substrate or a glass substrate, which has been pretreated as necessary, thereby forming a photosensitive resin layer. Any publicly known method can be used for laminating, but a coating method such as spin coating is suitable. The photosensitive resin composition can be laminated directly on the substrate or can be laminated with one or more intervening layers (for example, BARC). Further, an anti-reflective coating (for example, TARC) may be laminated above the photosensitive resin layer (opposite to the substrate). Layers other than the photosensitive resin layer are described later. Forming an anti-reflective coating above or under the photosensitive resin film makes it possible to improve the cross-sectional shape and the exposure margin.

Typical examples of the positive type or negative type photosensitive resin composition used in the method for manufacturing a resist pattern of the present invention include one comprising a quinonediazide-based photosensitizer and an alkali-soluble resin, and a chemically amplified type photosensitive resin composition. From the viewpoint of forming a fine resist pattern having high resolution, a chemically amplified type photosensitive resin composition is preferable, and examples thereof include a chemically amplified type PHS-acrylate hybrid-based EUV resist composition. It is more preferable that these are positive type photosensitive resin compositions.

Examples of the quinonediazide-based photosensitizer used in the positive type photosensitive resin composition comprising the quinonediazide-based photosensitizer and the alkali-soluble resin include 1,2-benzoquinonediazide-4-sulfonic acid, 1,2-naphthoquinonediazide-4-sulfonic acid, 1,2-naphthoquinone diazido-5-sulfonic acid, esters or amides of these sulfonic acids, or the like, and examples of the alkali-soluble resin include novolak resin, polyvinyl phenol, polyvinyl alcohol, copolymer of acrylic acid or methacrylic acid or the like. Preferable examples of novolac resin include those produced from one or more phenols such as phenol, o-cresol, m-cresol, p-cresol and xylenol, and one or more aldehydes such as formaldehyde and paraformaldehyde.

Further, as the chemically amplified type photosensitive resin composition, a positive type chemically amplified photosensitive resin composition comprising a compound (photoacid generator) that generates an acid by irradiation with radiation and resin whose polarity is increased by the action of an acid generated from the photoacid generator and whose solubility in a developer changes between the exposed portion and the unexposed portion, or a negative type chemically amplified photosensitive resin composition comprising an alkali-soluble resin, a photoacid generator and a crosslinking agent, in which crosslinking of the resin occurs by the action of the acid and the solubility in a developer changes between the exposed portion and the unexposed portion can be mentioned.

As the resin whose polarity is increased by the action of the acid and whose solubility in a developer changes between the exposed portion and the unexposed portion, resin having a group at the main chain or side chain of the resin, or both the main chain and the side chain of the resin, which decomposes by the action of the acid to generate an alkali-soluble group can be mentioned. Typical examples thereof include polymer in which an acetal group or a ketal group is introduced as a protective group into a hydroxystyrene-based polymer (PHS) (for example, JP H2-19847 A), and a similar polymer in which a t-butoxy carbonyloxy group or a p-tetrahydropyranyloxy group is introduced as an acid-decomposable group (JP H2-209977 A, etc.), and the like.

Further, the photoacid generator may be any compound that generates an acid by irradiating radiation, and examples thereof include onium salts such as diazonium salts, ammonium salts, phosphonium salts, iodonium salts, sulfonium salts, selenonium salts and arsonium salts, organic halogen compounds, organometallic compounds/organic halides, photoacid generators having an o-nitrobenzyl type protective group, compounds capable of photolysis to generate a sulfonic acid represented by iminosulfonate or the like, disulfon compounds, diazoketosulfone compounds, diazodisulfone compounds, and the like.

Further, compounds in which these groups or compounds capable of generating an acid by light are introduced into the main chain or the side chain of polymer can also be used.

Additionally, the above-mentioned chemically amplified type photosensitive resin composition can further comprise, if necessary, an acid-decomposable and dissolution inhibiting compound, a dye, a plasticizer, a surfactant, a photosensitizer, an organic basic compound, a compound that promotes solubility in a developer, and the like.

For example, the photosensitive resin composition is applied on a substrate by a suitable coating apparatus such as a spinner or coater by means of a suitable coating method, and is heated on a hot plate to remove the solvent in the photosensitive resin composition, thereby forming a photosensitive resin layer. The heating temperature varies depending on the solvent or resist composition used, but is generally performed at 70 to 150° C., preferably 90 to 150° C., and the heating can be performed for 10 to 180 seconds, preferably 30 to 90 seconds in the case of hot plate, or for 1 to 30 minutes in the case of clean oven.

In the method for manufacturing a resist pattern of the present invention, the presence of film(s) or layer(s) other than the photosensitive resin layer is also accepted. Without direct contact of the substrate with the photosensitive resin layer, intervening layer(s) may be interposed. The intervening layer is a layer to be formed between a substrate and a photosensitive resin layer and is referred also to as underlayer film. As the underlayer film, a substrate modifying film, a planarization film, a bottom anti-reflective coating (BARC), an inorganic hard mask intervening layer (silicon oxide film, silicon nitride film and silicon oxynitride film), and an adhesion film can be referred. As to the formation of the inorganic hard mask intervening layer, JP 5,336,306 B can be referenced. The intervening layer may be composed of one layer or a plurality of layers. In addition, a top anti-reflective coating (TARC) may be formed on the photosensitive resin layer.

For the layer constitution in the process for manufacturing a resist pattern of the present invention, any publicly known technique can be used in accordance with process conditions. For example, the following layer constitution can be referred.

substrate/underlayer film/photosensitive resin layer
substrate/planarization film/BARC/photosensitive resin layer
substrate/planarization film/BARC/photosensitive resin layer/TARC
substrate/planarization film/inorganic hard mask intervening layer/photosensitive resin layer/TARC
substrate/planarization film/inorganic hard mask intervening layer/BARC/photosensitive resin layer/TARC
substrate/planarization film/adhesion film/BARC/photosensitive resin layer/TARC
substrate/substrate modifying layer/planarization film/BARC/photosensitive resin layer/TARC
substrate/substrate modifying layer/planarization film/adhesion film/BARC/photosensitive resin layer/TARC These layers can be formed by coating and thereafter heating and/or exposing to cure, or by employing any publicly known method such as CVD method. These layers can be removed by any publicly known method (etching or the like) and can be patterned using the upper layer as a mask.

The photosensitive resin layer is exposed through a predetermined mask. When other layers (TARC or the like) are also included, they may be exposed together. The wavelength of the radiation (light) used for exposure is not particularly limited, but it is preferable to perform exposure with light having a wavelength of 13.5 to 248 nm. In particular, KrF excimer laser (wavelength: 248 nm), ArF excimer laser (wavelength: 193 nm), extreme ultraviolet ray (wavelength: 13.5 nm) and the like can be used, and extreme ultraviolet ray is more preferable. These wavelengths allow a range of ±5%, and preferably a range of ±1%. After the exposure, post exposure bake (PEB) may be performed, if needed. The temperature for post exposure baking is appropriately selected from 70 to 150° C., preferably 80 to 120° C., and the heating time is appropriately selected from 0.3 to 5 minutes, preferably 0.5 to 2 minutes.

Thereafter, development is performed with a developer. For the development in the method for manufacturing a resist pattern of the present invention, a 2.38 mass % (±1% is accepted) tetramethylammonium hydroxide (TMAH) aqueous solution is preferably used. Further, a surfactant or the like may also be added to the developer. The temperature of the developer is appropriately selected from generally 5 to 50° C., preferably 25 to 40° C., and the developing time is appropriately selected generally from 10 to 300 seconds, preferably 20 to 60 seconds. As the developing method, any publicly known method such as paddle development can be used.

As described above, the resist pattern of the present invention includes not only one obtained by exposing/developing a resist film but also one having a wall thickened by further covering a resist film with other layer(s) or film(s).

The resist pattern (the developed photosensitive resin layer) formed up to the above steps is in a non-cleaned state. This resist pattern can be cleaned with the electronic device manufacturing aqueous solution of the present invention. The time for bringing the electronic device manufacturing aqueous solution into contact with the resist pattern, that is, the processing time is preferably 1 second or more. In addition, the processing temperature may be also freely determined. The method for bringing the electronic device manufacturing aqueous solution into contact with the resist is also freely selected, and it can be performed, for example, by immersing a resist substrate in the electronic device manufacturing aqueous solution or dropping the electronic device manufacturing aqueous solution on a rotating resist substrate surface.

In the method for manufacturing a resist pattern according to the present invention, the resist pattern after being developed can be cleaned with other cleaning liquid before and/or after the cleaning processing with the electronic device manufacturing aqueous solution. The other cleaning liquid is preferably water, and more preferably pure water (DW, deionized water, or the like). The cleaning before the present processing is useful for cleaning the developer that has adhered to the resist pattern. The cleaning after the present processing is useful for cleaning the electronic device manufacturing aqueous solution. One preferred embodiment of the manufacturing method according to the present invention is a method comprising cleaning the pattern after being developed while substituting the developer by pouring pure water on the resist pattern, and further cleaning the pattern while substituting pure water by pouring the electronic device manufacturing aqueous solution while keeping the pattern immersed in pure water.

The cleaning with the electronic device manufacturing aqueous solution may be carried out by any publicly known method. It can be performed, for example, by immersing a resist substrate in the electronic device manufacturing aqueous solution, or by dropping the electronic device manufacturing aqueous solution on a rotating resist substrate surface. These methods may be also carried out in appropriate combination thereof.

As one of the conditions under which pattern collapse is likely to occur, there is a place where the distance between a wall and a wall of a resist pattern is the narrowest. At a place where a wall and a wall of a resist pattern are aligned in parallel, this becomes a severe condition. In the present specification, the distance of the interval at the place where the interval is the smallest on one circuit unit is defined as the minimum space size. It is preferable that one circuit unit becomes one semiconductor in a later process. Further, it is also a preferable embodiment that one semiconductor includes one circuit unit in the horizontal direction and a plurality of circuit units in the vertical direction. Of course, unlike the test sample, if the occurrence frequency of the place where the interval between a wall and a wall is narrow is low, the occurrence frequency of defects decreases, so that the occurrence frequency of defective products decreases.

In the present invention, the minimum space size of the resist pattern in one circuit unit is preferably 10 to 30 nm, more preferably 10 to 20 nm, and further preferably 10 to 17 nm.

<Method for Manufacturing a Device>

The method for manufacturing a device of the present invention comprises the method for manufacturing a resist pattern using the electronic device manufacturing aqueous solution. Preferably, the method for manufacturing a device according to the present invention further comprising etching the resist pattern manufactured by the above-mentioned method as a mask and processing a substrate. After processing, the resist film is peeled off, if necessary. Preferably, the device is a semiconductor.

In the manufacturing method of the present invention, the intervening layer and/or the substrate can be processed by etching using the resist pattern as a mask. For etching, any publicly known method such as dry etching and wet etching can be used, and dry etching is more suitable. For example, the intervening layer can be etched using the resist pattern as an etching mask, and the substrate can be etched using the obtained intervening layer pattern as an etching mask to process the substrate. Further, while etching the layer(s) under the resist layer (for example, an intervening layer) using the resist pattern as an etching mask, the substrate can also be uninterruptedly etched. The processed substrate becomes, for example, a patterned substrate. A wiring can be formed on the substrate by utilizing the formed pattern.

These layers can be removed preferably by performing dry etching with $O_2$, $CF_4$, $CHF_3$, $Cl_2$ or $BCl_3$, and preferably, $O_2$ or $CF_4$ can be used.

As a preferred embodiment, the method for manufacturing a device according to the present invention further comprises forming a wiring on a processed substrate.

<Stress Applied to a Resist Wall>

As described in Namatsu et al., Appl. Phys. Lett. 1995 (66), p 2655-2657 and schematically illustrated in FIG. 1, the stress applied to a wall during drying rinse can be indicated by the following formula:

$$\sigma_{max}=(6\gamma\cos\theta/D)\times(H/W)^2$$

where $\sigma_{max}$: maximum stress applied to a resist, $\gamma$: surface tension of rinse $\theta$: contact angle, D: distance between walls H: height of wall, and W: width of wall These lengths can be measured by a known method (for example, SEM photograph).

As can be seen from the above formula, the shorter D or W is, the more stress is caused. In the present specification, "pitch size" means, as described in FIG. 1, one unit of a resist pattern unit sequence having W and D.

This means that the finer (narrower pitch size) the required resist pattern is, the greater the stress applied to the resist pattern becomes. As the pattern becomes finer in this way, the conditions become stricter, and more improvements are required for the electronic device manufacturing aqueous solution (for example, a rinse composition).

The present invention is described below with reference to various examples. Further, the embodiments of the present invention are not limited to these examples.

Preparation Example of Example 101

Into deionized water, n-hexanoic acid as the alkylcarboxylic acid compound (A) is added to make its concentration 0.2 mass % and stirred. Visually, its complete dissolvement is confirmed. This is filtered (pore size=10 nm) to obtain an aqueous solution of Example 101.

Preparation Examples of Examples 102 to 112 and Comparative Preparation Examples of Comparative Examples 101 to 103

In the same manner as in Preparation Example of Example 101 above, using the alkylcarboxylic acid compound (A) and the basic compound (C) as shown in Table 1, aqueous solutions of Examples 102 to 112 and Comparative Examples 101 to 103 are prepared so as to have the concentrations as shown in Table 1. Further, Comparative Example 101 is one, in which deionized water to which nothing is added, is filtered.

TABLE 1

| | | Alkylcarboxylic acid compound (A) (mass %) | Basic compound (C) (mass %) | Collapse prevention |
|---|---|---|---|---|
| Example | 101 | n-hexanoic acid (0.2) | — | A |
| | 102 | 2-methylpentanoic acid (0.2) | — | A |
| | 103 | n-heptanoic acid (0.1) | — | A |
| | 104 | 2-methylhexanoic acid (0.1) | — | A |
| | 105 | 2,2-dimethylpentanoic acid (0.1) | — | A |
| | 106 | 5-methylhexanoic acid (0.1) | — | A |
| | 107 | n-octanoic acid (0.05) | — | A |
| | 108 | 2-ethylhexanoic acid (0.05) | 1,4-butanediol (0.05) | A |
| | 109 | 2-methylheptanoic acid(0.03) | — | A |
| | 110 | 2-propylpentanoic acid (0.05) | — | A |
| | 111 | 3,5,5-trimethylhexanoic acid (0.05) | 1,4-butanediol (0.05) | A |
| | 112 | 4-methyl-n-octanoic acid (0.1) | 2,2,3,3-tetra-fluoro-1,4-butanediol (0.1) | A |
| Comparative Exampl | 101 | — | — | B |
| | 102 | acetic acid (0.1) | — | B |
| | 103 | propionic acid (0.1) | — | B |

<Evaluation Substrate Production 1>

A bottom anti-reflective coating-forming composition (AZ Kr-F17B, Merck Performance Materials (hereinafter referred to as MPM)) is applied on a silicon substrate by spin coating, and heating is performed on a hot plate at 180° C. for 60 seconds to obtain a bottom anti-reflective coating having a film thickness of 80 nm. A PHS-acrylate-based chemically amplified type resist (DX6270P, MPM) is applied on this and heating is performed on a hot plate at 120° C. for 90 seconds to obtain a resist film having a film thickness of 620 nm. This substrate is exposed using a KrF stepper (FPA3000 EX5, Canon) through a mask (250 nm, line/space=1:1). At this time, the exposure amount is changed from 25 mJ/cm$^2$ to 40 mJ/cm$^2$ so that the line width to be obtained is changed.

After that, post-exposure baking (PEB) is performed on a hot plate at 100° C. for 60 seconds, a developer that is a 2.38 mass % TMAH aqueous solution is poured in, and thereafter this state is held for 60 seconds (paddle). In the state that the developer is paddled, water pouring is started. While rotating the substrate, the developer is replaced with water, this treatment is stopped in the state of being paddled with water, and this state is left standing for 60 seconds. After that, the aqueous solution of Example 101 prepared above is poured into the state of being paddled with water, the water is replaced with the aqueous solution of Example 101, the pouring of the aqueous solution of Example 101 is stopped for 10 seconds in the state of being paddled with the aqueous solution of Example 101. The substrate is dried by spin drying for 30 seconds.

For Examples 102 to 112 and Comparative Examples 101 to 103, the evaluation substrate production is performed in the same manner as above using the respective aqueous solutions.

<Evaluation of Collapse Prevention>

Using the evaluation substrates of Production 1, evaluation of the pattern collapse prevention performance is carried out. The resist pattern is observed using an SEM equipment S-9220 (Hitachi High-Technologies), and the presence or absence of pattern collapse is observed. The evaluation criteria are shown below. In Comparative Example 101, pattern collapse is confirmed in a resist pattern having a line width of 187 nm. The results are as shown in Table 1.

A: No pattern collapse is confirmed in the resist pattern having a line width of 150 nm or more and 177 nm or less.

B: Pattern collapse is confirmed in the resist pattern having a line width of 150 nm or more and 187 nm or less.

C: Pattern collapse is confirmed in the resist pattern having a line width larger than 187 nm.

Preparation Example of Example 201

Into deionized water, 2-methyhexanoic acid and 1,4-butanediol are added to make their concentrations respectively 0.2 mass % and 0.1 mass % and stirred. Visually, their complete dissolvement is confirmed. This is filtered (pore size=10 nm) to obtain an aqueous solution of Example 201.

Preparation Examples of Examples 202 to 205 and Comparative Preparation Example of Comparative Example 201

In the same manner as in Preparation Example of Example 201 above, using the alkylcarboxylic acid compound (A) and the basic compound (C) as shown in Table 2, aqueous solutions of Examples 202 to 205 and Comparative Example 201 are prepared so as to have the concentrations as shown in Table 2. Further, Comparative Example 201 is one, in which deionized water to which nothing is added, is filtered.

Preparation Example of Example 206

Into deionized water, 2-ethyhexanoic acid and ammonia are added to make their concentrations respectively 0.1 mass % and 0.05 mass % and stirred. Visually, their complete dissolvement is confirmed. This is filtered (pore size=10 nm) to obtain an aqueous solution of Example 206.

TABLE 2

| | | Alkylcarboxylic acid compound (A) (mass %) | Basic compound (C) (mass %) | Limit pattern size (nm) | LWR (nm) |
|---|---|---|---|---|---|
| Example | 201 | 2-methylpentanoic acid (0.2) | 1,4-butanediol(0.1) | 15.7 | 3.7 |
| | 202 | n-heptanoic acid (0.2) | — | 15.6 | 3.6 |
| | 203 | 2-methylhexanoic acid (0.1) | — | 15.4 | 3.6 |
| | 204 | 2-ethylhexanoic acid (0.1) | 2,2,3,3-tetrafluoro-1,4-butanediol (0.1) | 14.8 | 3.5 |
| | 205 | 3,5,5-trimethylhexanoic acid (0.1) | 1,4-butanediol(0.1) | 15.2 | 3.6 |
| | 206 | 2-ethylhexanoic acid (0.1) | — | 15.1 | 3.7 |
| Comparative Example | 201 | — | — | 17.3 | 3.6 |

<Evaluation Substrate Production 2>

A silicon substrate is treated with hexamethyldisilazane (HMDS) at 90° C. for 30 seconds. A PHS-acrylate-based chemically amplified type resist for EUV is applied thereon by spin coating and heating is performed on a hot plate at 110° C. for 60 seconds to obtain a resist film having a film thickness of 45 nm. This substrate is exposed using an EUV stepper (NXE: 3300B, ASML) through a mask (18 nm, line/space=1:1). At this time, the exposure amount is changed so that the line width to be obtained is changed. After that, post-exposure baking (PEB) is performed on a hot plate at 100° C. for 60 seconds, a developer that is a 2.38 mass % TMAH aqueous solution is poured in, and thereafter this state is held for 30 seconds (paddle). In the state that the developer is paddled, water pouring is started. While rotating the substrate, the developer is replaced with water, this treatment is stopped in the state of being paddled with water, and this state is left standing for 60 seconds. After that, the aqueous solution of Example 201 is poured into the state of being paddled with water, the water is replaced with the aqueous solution of Example 201, the pouring of the aqueous solution of Example 201 is stopped for 10 seconds in the state of being paddled with the aqueous solution of Example 201. This substrate is dried by spin drying.

For Examples 202 to 206 and Comparative Example 201, the evaluation substrate production is performed in the same manner as above using the respective aqueous solutions.

<Evaluation of Limit Pattern Size>

Using a length measuring SEM CG5000 (Hitachi High-Technologies), line width and existence or absence of pattern collapse of the resist pattern formed on the evaluation substrates of Production 2 are observed. As the amount of exposure increases, the line width decreases. The minimum line width size at which no pattern collapse occurs is defined as "limit pattern size".

In the case of the aqueous solution of Comparative Example 201, pattern collapse is confirmed at a line size of 16.4 nm. On the other hand, since no collapse is confirmed at 17.3 nm, the limit pattern size is set to 17.3 nm. The results are as shown in Table 2.

<Evaluation of LWR>

The LWR of the resist pattern formed on the evaluation substrates of Production 2 is evaluated. Using SEM CG5000 (Hitachi High-Technologies), the LWR (Line Width Roughness) of the resist pattern having a line width of 18 nm is measured. The results are as shown in Table 2.

The invention claimed is:

1. A method for manufacturing a resist pattern comprising the following steps:

(1) applying a photosensitive resin composition on a substrate with or without one or more intervening layers, to form a photosensitive resin layer;

(2) exposing the photosensitive resin layer to radiation;

(3) developing the exposed photosensitive resin layer; and (4) cleaning the developed layer with a resist pattern cleaning liquid comprising an alkylcarboxylic acid compound (A); and a solvent (B), wherein the content of the solvent (B) is 80 to 99.99 mass %, based on the resist pattern cleaning liquid, wherein the alkylcarboxylic acid compound (A) is represented by the formula (a):

$$A_1\text{-COOH} \quad (a)$$

where $A_1$ is $C_{4-12}$ alkyl and the solvent (B) comprises water, wherein the content of water contained in the solvent (B) is 80 to 99.99 mass %, based on the resist pattern cleaning liquid.

2. The method for manufacturing a resist pattern according to claim 1, wherein the photosensitive resin composition is a chemically amplified photosensitive resin composition.

3. The method for manufacturing a resist pattern according to claim 1, wherein the photosensitive resin composition is a chemically amplified photosensitive resin composition, and exposure is performed using extreme ultraviolet ray.

4. The method for manufacturing a resist pattern according to claim 1, wherein the minimum space size of the resist pattern in one circuit unit is 10 to 30 nm.

5. A method for manufacturing a device, comprising the method for manufacturing a resist pattern according to claim 1.

6. The method for manufacturing a device which comprises etching the resist pattern manufactured by the method according to claim 1 as a mask, and processing a substrate.

7. The method for manufacturing a device according to claim 6, further comprising forming a wiring on a processed substrate.

8. The method for manufacturing a resist pattern according to claim 1, wherein the resist pattern cleaning liquid further comprises a hydroxy-containing compound (C).

9. The method for manufacturing a resist pattern according to claim 8, wherein the content of the alkylcarboxylic acid compound (A) is 0.01 to 10 mass %, based on the electronic device manufacturing aqueous solution.

10. The method for manufacturing a resist pattern according to claim 1, wherein the resist pattern cleaning liquid further comprises a surfactant (D).

11. The method for manufacturing a resist pattern according to claim 10, where the resist pattern cleaning liquid further comprises an additive (E), wherein the additive (E) comprises an acid, a base, a germicide, an antibacterial agent, a preservative, a fungicide, or any combination of any of these.

12. The method for manufacturing a resist pattern according to claim 11, wherein the additive (E) comprises a base;

the content of the surfactant (D) is 0.01 to 5 mass %, based on the resist pattern cleaning liquid; or the content of the additive (E) is 0.0001 to 10 mass %, based on the resist pattern cleaning liquid.

* * * * *